United States Patent
Zou et al.

(10) Patent No.: US 8,555,215 B2
(45) Date of Patent: Oct. 8, 2013

(54) METHODS FOR DECOMPOSING CIRCUIT DESIGN LAYOUTS AND FOR FABRICATING SEMICONDUCTOR DEVICES USING DECOMPOSED PATTERNS

(75) Inventors: Yi Zou, Foster City, CA (US); Swamy Maddu, Sunnyvale, CA (US); Lynn T. Wang, Fremont, CA (US); Vito Dai, Santa Clara, CA (US); Luigi Capodieci, Santa Cruz, CA (US); Peng Xie, Rochester, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/400,445

(22) Filed: Feb. 20, 2012

(65) Prior Publication Data

US 2013/0219347 A1 Aug. 22, 2013

(51) Int. Cl.
*G06F 17/50* (2006.01)
(52) U.S. Cl.
USPC .......... 716/55; 716/50; 716/51; 716/52; 716/53; 716/54; 716/124; 716/125; 716/139
(58) Field of Classification Search
USPC .......... 716/50–55, 124–125, 139; 430/5, 30
See application file for complete search history.

(56) References Cited

U.S. PATENT DOCUMENTS

| | | | | |
|---|---|---|---|---|
| 8,132,128 B2* | 3/2012 | Song et al. | | 716/51 |
| 8,402,397 B2* | 3/2013 | Robles et al. | | 716/52 |
| 2013/0010100 A1* | 1/2013 | Kotaki et al. | | 348/80 |

OTHER PUBLICATIONS

Tritchkov et al., Double Patterning Decomposition, Design compliance, and Verification Algorithms at 32 nm hp, 2008, SPIE, vol. 7122, pp. 1-15.*

* cited by examiner

*Primary Examiner* — Nghia Doan
(74) *Attorney, Agent, or Firm* — Ingrassia Fisher & Lorenz, P.C.

(57) ABSTRACT

Methods for fabricating semiconductor devices are provided. In an embodiment, a method of fabricating a semiconductor device includes scanning a circuit design layout and proposing patterns for decomposed layouts. The proposed patterns are then compared with a library of prior patterns including a category of forbidden patterns and a category of preferred patterns. If a selected proposed pattern matches a forbidden pattern, the selected proposed pattern is eliminated. If the selected proposed pattern matches a preferred pattern, then the selected proposed pattern is identified for use in the decomposed layouts. Decomposed layouts are generated from the identified patterns. A plurality of masks is fabricated based on the decomposed layouts. Then a multiple patterning lithographic technique is performed with the plurality of masks on a semiconductor substrate.

18 Claims, 4 Drawing Sheets

METHODS FOR DECOMPOSING CIRCUIT DESIGN LAYOUTS AND FOR FABRICATING SEMICONDUCTOR DEVICES USING DECOMPOSED PATTERNS

TECHNICAL FIELD

The present disclosure generally relates to methods for fabricating semiconductor devices using multiple patterning lithographic techniques, and more particularly relates to methods for decomposing circuit design layouts for a double patterning technique.

BACKGROUND

Semiconductor devices include many electronic components, such as transistors, resistors, capacitors, and diodes. Semiconductor devices are designed by transforming logical or circuit descriptions of the semiconductor device components into geometric descriptions, called design layouts. Design layouts often describe the behavioral, architectural, functional, and structural attributes of the semiconductor device. Electronic design automation ("EDA") applications are typically used to create the design layouts. These applications provide sets of computer-based tools for creating, editing, analyzing, and verifying design layouts.

Fabrication foundries manufacture semiconductor devices based on the design layouts using photolithographic processes. To fabricate a semiconductor device, photomasks are created using the design layout as a template. The photomasks contain the various geometries (i.e., features) of the semiconductor device design layout. Through sequential use of the various photomasks corresponding to a given semiconductor device in a fabrication process, a large number of material layers of various shapes and thicknesses with various conductive and insulating properties may be built up to form the overall semiconductor device and the circuits within the design layout.

Some features cannot be photolithographically printed with a conventional single exposure process. Therefore, fabrication processes have implemented a multiple exposure photolithographic process, such as a double patterning technique (DPT). In DPT, the design layout is decomposed to a first decomposed layout and a second decomposed layout. Existing decomposition tools for decomposing layouts into one or more decomposed layouts are often rule based and proceed on a pattern by pattern (i.e., geometry by geometry) basis. After decomposition to the first and second masks, post-decomposition rule checks including a Design Rule Check and a Mask Rule Check are performed to determine whether the proposed first and second masks are rule compliant. A Mask Data Preparation (MDP) operation is then performed to yield a manufacturable mask layout. Despite the testing performed, some decomposed layouts that comply with post-decomposition rule checks yield mask layouts with printability failure points, especially at the presence of process variation.

Accordingly, it is desirable to provide improved methods for fabricating semiconductor devices using multiple patterning lithographic techniques. Also, it is desirable to provide methods for decomposing design layouts for multiple patterning lithographic techniques that avoid printability failure points in decomposed layouts. Furthermore, other desirable features and characteristics will become apparent from the subsequent detailed description and the appended claims, taken in conjunction with the accompanying drawings and the foregoing technical field and background.

BRIEF SUMMARY

Methods are provided for fabricating a semiconductor device. In accordance with one embodiment, a method of fabricating a semiconductor device includes scanning a circuit design layout and proposing patterns for decomposed layouts. The proposed patterns are then compared with a library of prior patterns including a category of forbidden patterns and a category of preferred patterns. If a selected proposed pattern matches a forbidden pattern, the selected proposed pattern is eliminated. If the selected proposed pattern matches a preferred pattern, then the selected proposed pattern is identified for use in the decomposed layouts. Decomposed layouts are generated from the identified patterns. A plurality of masks is fabricated based on the decomposed layouts. Then a multiple patterning lithographic technique is performed with the plurality of masks on a semiconductor substrate.

In another embodiment, a computer-executed method is provided for decomposing a circuit design layout to decomposed layouts for a multiple patterning lithographic technique. In the method, a library of prior patterns, including a category of forbidden patterns, is provided. The method includes scanning the circuit design layout and proposing patterns for the decomposed layouts. Then the proposed patterns are compared with the library of prior patterns. If a selected proposed pattern matches a forbidden pattern, the selected proposed pattern is eliminated.

In accordance with another embodiment, a method for fabricating a plurality of masks for a multiple patterning lithographic technique is provided. The method includes providing a library of prior patterns, including a category of forbidden patterns and a category of preferred patterns. The method includes scanning a circuit design layout for the semiconductor device and proposing patterns for decomposed layouts. The proposed patterns are then compared with the library of prior patterns. If a selected proposed pattern matches a forbidden pattern, the selected proposed pattern is eliminated. If the selected proposed pattern matches a preferred pattern, the selected proposed pattern is identified for use in the decomposed layouts. Detailed decomposition information associated with the preferred pattern matched with the identified proposed pattern is communicated to a decomposition tool. The decomposed layouts are generated from the detailed decomposition information and the plurality of masks is fabricated from the decomposed layouts.

BRIEF DESCRIPTION OF THE DRAWINGS

Embodiments of the methods of fabrication will hereinafter be described in conjunction with the following drawing figures, wherein like numerals denote like elements, and wherein.

DETAILED DESCRIPTION

The following detailed description is merely exemplary in nature and is not intended to limit the semiconductor device fabrication, lithographic mask fabrication, or circuit design layout decomposition methods. Furthermore, there is no intention to be bound by any expressed or implied theory presented in the preceding technical field, background or brief summary, or in the following detailed description.

Figure 1:
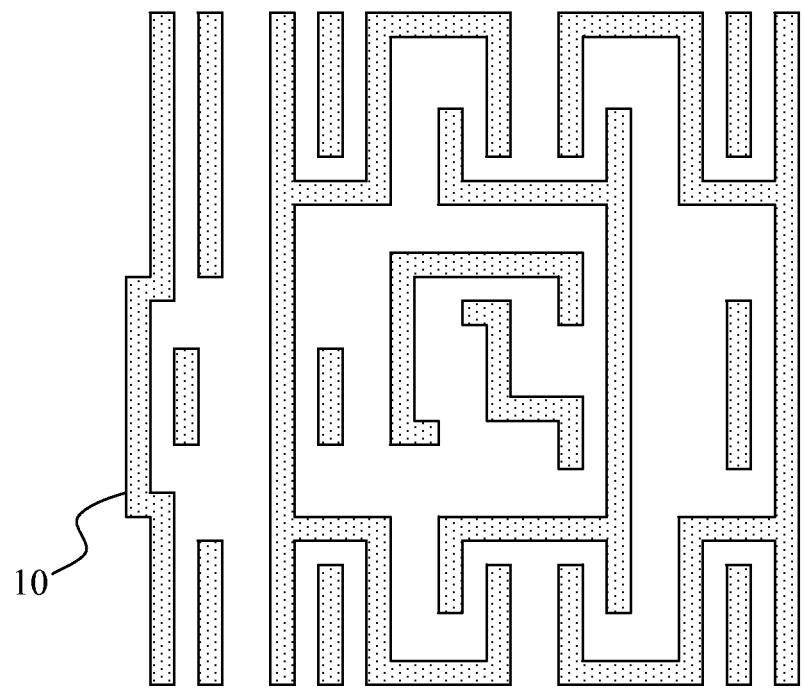
FIG. 1 is an overhead view of a circuit design layout for decomposition in accordance with various embodiments herein.
Figure 2:
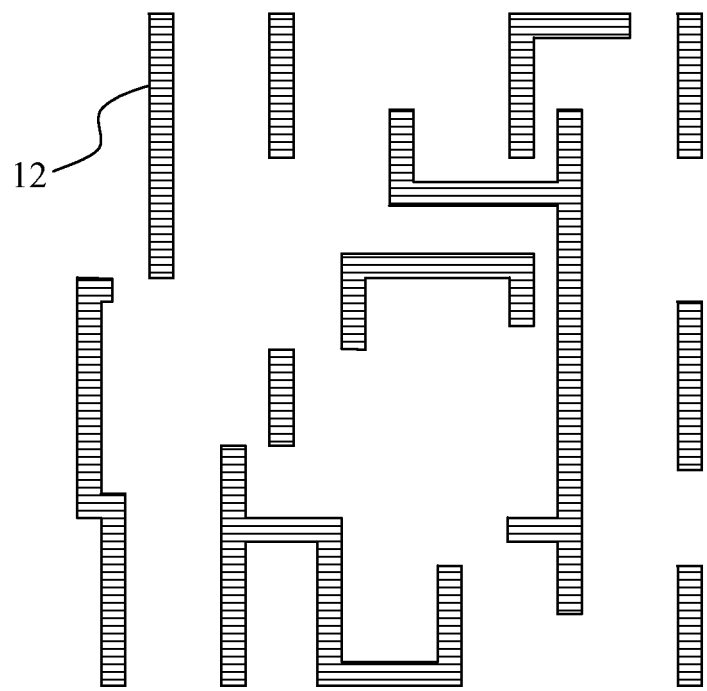
FIGS. 2-4 are overhead views of decomposed layouts of the circuit design layout of FIG. 1 in accordance with various embodiments herein.
Figure 3:
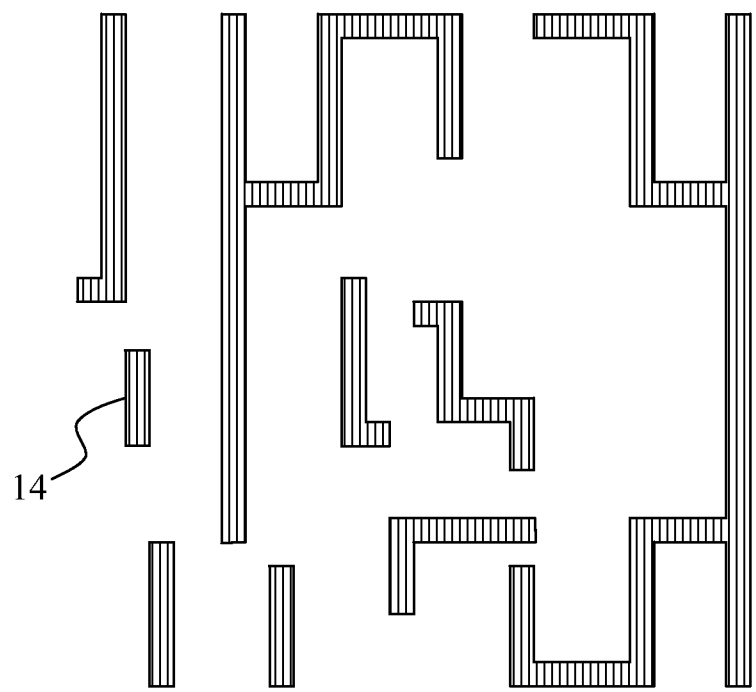
Figure 4:
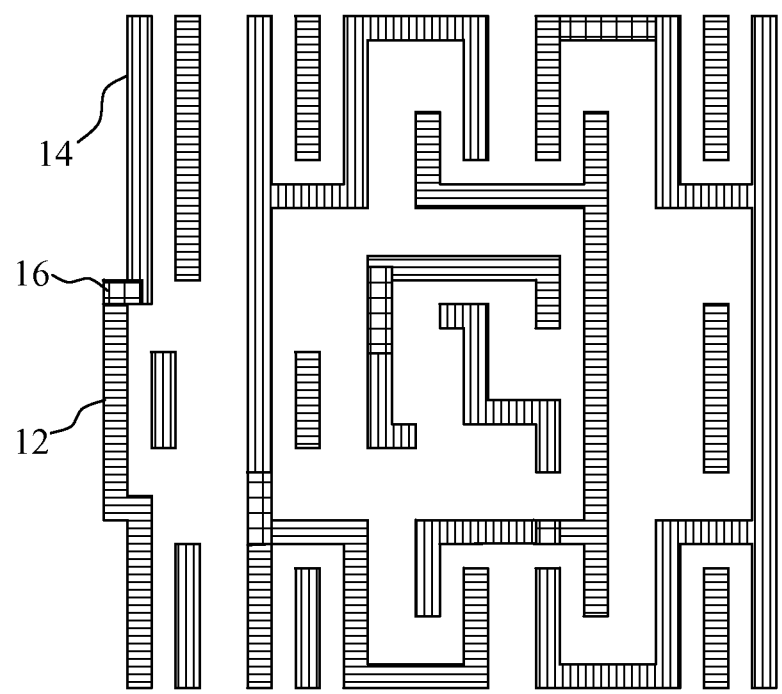

In accordance with the various embodiments herein, methods for fabricating semiconductor devices and for fabricating lithographic masks involve decomposing circuit design layouts. An exemplary circuit design layout 10 is shown in FIG. 1. For typical fabrication methods using multiple patterning lithographic techniques with two patterns, such as a Litho-Etch-Litho-Etch (LELE), Sidewall Spacer Double Patterning (SADP), Litho-Freeze-Litho-Etch (LFLE), or other Double Patterning Techniques (DPT), the circuit design layout 10 is decomposed to two decomposed layouts 12 and 14, as shown in FIGS. 2 and 3. FIG. 4 shows the decomposed layouts 12 and 14 aligned, with overlying areas 16 covered by both decomposed layouts.

Generally, the geometries of the decomposed layouts 12 and 14 are dependent on the design layout 10, technology node, decomposition rules and decomposition algorithm. Post-decomposition rule checks include Design Rule Check and Mask Rule Check which are performed on the two decomposed layouts to find violations. If violations are found, the decomposed layouts 12 and 14 are revised. After these post-decomposition rule checks, a set of geometry operations are performed in order to yield manufacturable mask layouts from the decomposed layouts. These geometry operations are collectively referred to as Mask Data Preparation, and include without limitation Retargeting, Biasing, Assist Feature generation, and Optical Proximity Correction. Then, a set of rule checks including Mask Rule Check and Optical Rule Check are performed with model-based printability verification to determine whether the mask is manufacturable.

In conventional methods, some decomposed layouts complying with post-decomposition rule checks yield printability failure points, also called "hotspots", especially in the presence of process variation. Manufacturing process variation manifests as defects in semiconductor device layout features in silicon. These process variations, which may include dose variations, focus variations, and mask errors, are unavoidable. As a consequence, the only way to mitigate their effect is to enhance layout robustness through process simulations that check for layout "hotspots". Printability failure points indicate a flaw or flaws in the decomposition solution provided by tools used to produce manufacturable decomposed layouts. The flaws and failure points hinder process technology in semiconductor fabrication.

Conventional DPT decomposition tools use geometry-based decomposition rules to separate the design layout onto two mask layers. The decomposition rules are extracted from standard technology and process conditions, for instance, the minimum same mask polygon tip-to-tip distance, minimum same mask polygon tip-to-side distance, and minimum overlap area when stitching a polygon. After decomposition, a set of rule-based post-decomposition checks are performed to locate violations in individual mask layers. If a violation is found, designers adjust the layout to be DPT compliant. Thereafter, violation-free mask layers enter Mask Data Preparation (MDP) flow to yield manufacturable mask layouts.

For each mask layer entering MDP flow, the manufacturability is not guaranteed even under optimum MDP conditions. This is largely due to the rule-based nature of decomposition algorithms, and simplified/generalized rules (e.g. where to cut or how to stitch). On the other hand, model-based rigorous decomposition is computationally very expensive, and its complexity increases with the reduction in Critical Dimension and technology node.

The methods disclosed herein use novel processes to generate decomposed layouts that are both post-decomposition rule check compliant and manufacturable after optimized MDP. The processes are based on creating a library of patterns, including decomposable but problematic layout patterns that (A) cannot pass a printability check (forbidden patterns) or (B) can pass a printability check, but only with specific decomposition (preferred patterns). The processes are implemented in a software system (CAD Flow) which allows for fast matching between the design layout and the library of patterns to detect matched patterns. Decomposition data associated with matched patterns is forwarded to decomposition tools from the library to generate decomposed layouts.

The methods disclosed herein inhibit printability failure points by using an extended set of geometrical layout decomposition patterns that are selected to create the library of patterns. The selection of patterns is made possible by extensive lithographic analysis which employs simulation of the decomposed layout to identify printability failure points. Once printability failure points are identified, a fix is investigated to modify the pattern iteratively. If a solution is found and generates manufacturable results according to lithographic analysis, the pattern (from group B above), as modified, is added to a category of preferred patterns in the library. If no solutions are found, then the original pattern (from group A above) is added to a forbidden category in the library. The library of patterns can be filtered through pattern classification to extract only the unique configurations.

After the pattern library has been created, circuit design layouts are scanned with a 2-D pattern matching engine to locate any pattern match with pattern library, prior to decomposition. If matched pattern belongs to preferred pattern category in the library, detailed decomposition information associated with the matched pattern is forwarded to decomposition tools to generate preferred decomposition results. If a matched pattern belongs to the forbidden pattern category in the library, the matched pattern needs to be modified or removed from design layout to improve semiconductor device manufacturability.

Figure 5:
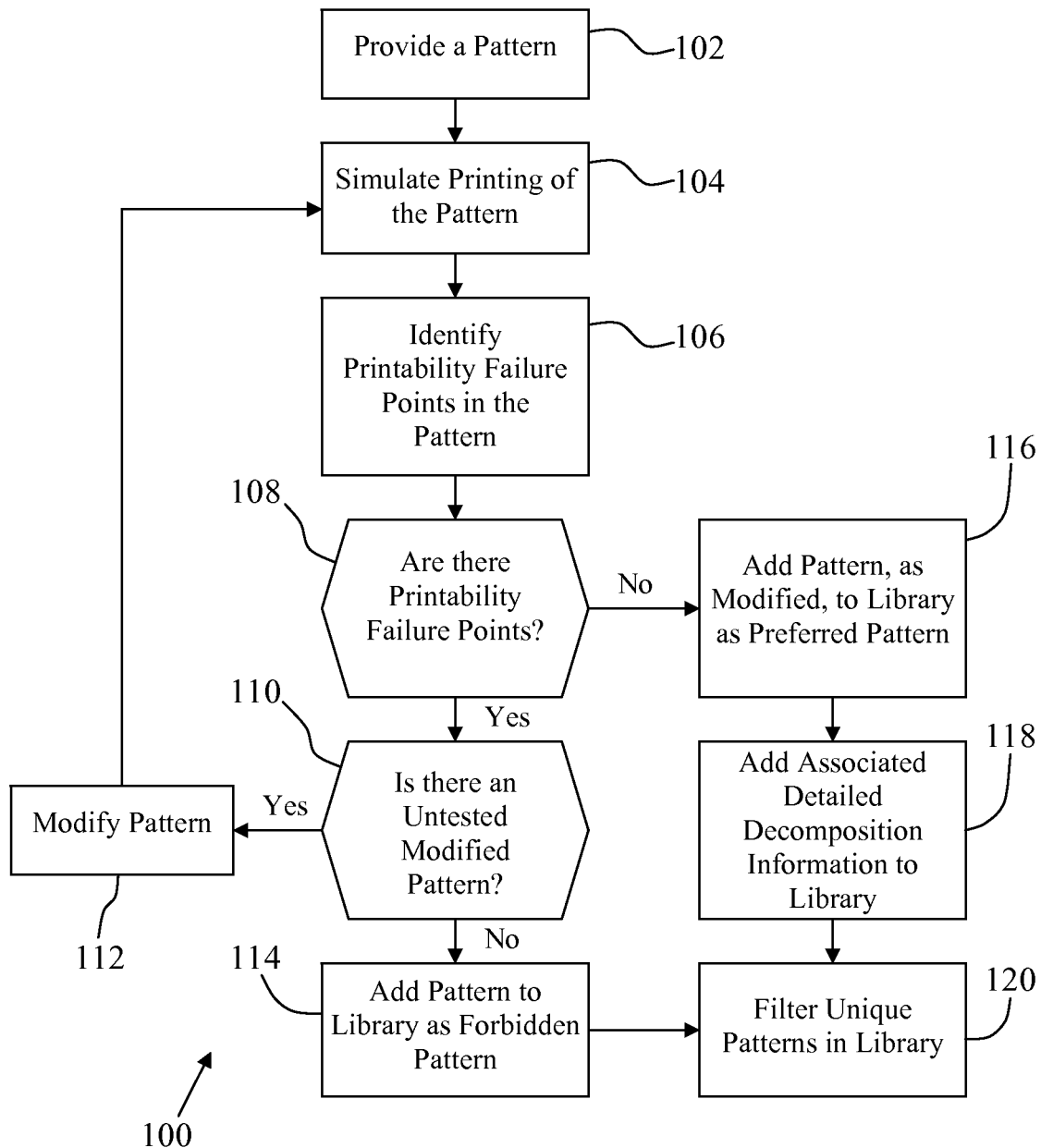
FIG. 5 illustrates, in a flow diagram, method steps for providing a library of patterns for use in circuit design layout decomposition and semiconductor device fabrication in accordance with various embodiments herein.

FIG. 5 illustrates a method 100 for providing a library of prior patterns in accordance with various embodiments herein. In an exemplary embodiment, the method 100 of providing a library of prior patterns begins by providing a geometrical layout decomposition pattern (step 102). Exemplary patterns are identified 12 and 14 in FIGS. 2 and 3. Typically, patterns include polygons which, in combination with other geometrical layout decomposition patterns, can be used to construct a decomposed circuit layout.

In step 104, printing of the pattern is simulated. Then, the print simulation is inspected for printability failure points, or "hotspots", in step 106. At step 108, the method queries whether there are any printability failure points. If printability failures are detected, then it is determined at step 110 whether the pattern can be modified to a pattern that has not been tested, i.e., a pattern that has not been printed in simulation and inspected for printability failure points. If untested patterns are available, then the pattern in modified at step 112 and printing is simulated for the modified pattern at step 104. If no untested patterns remain, then the pattern (including the original pattern and any modified patterns) is added to a forbidden pattern category in a library at step 114.

If, at step 108, no printability failure points are identified, then the pattern, as tested, i.e., including any prior modifications, is added to a preferred pattern category in the library at step 116. Step 118 adds to the library detailed decomposition information such as pattern geometric characteristics, stitch locations, hotspot or failure locations, and any additional hints to mitigate the hotspots associated with the pattern added to the library in step 116. In step 120, the library is filtered to locate unique patterns for selection during decomposition processes. It is noted that method 100 is completely computer executed and provides a "living" library. In other words, the library may be continually added to during processing to keep the categories of forbidden and preferred patterns updated.

Figure 6:
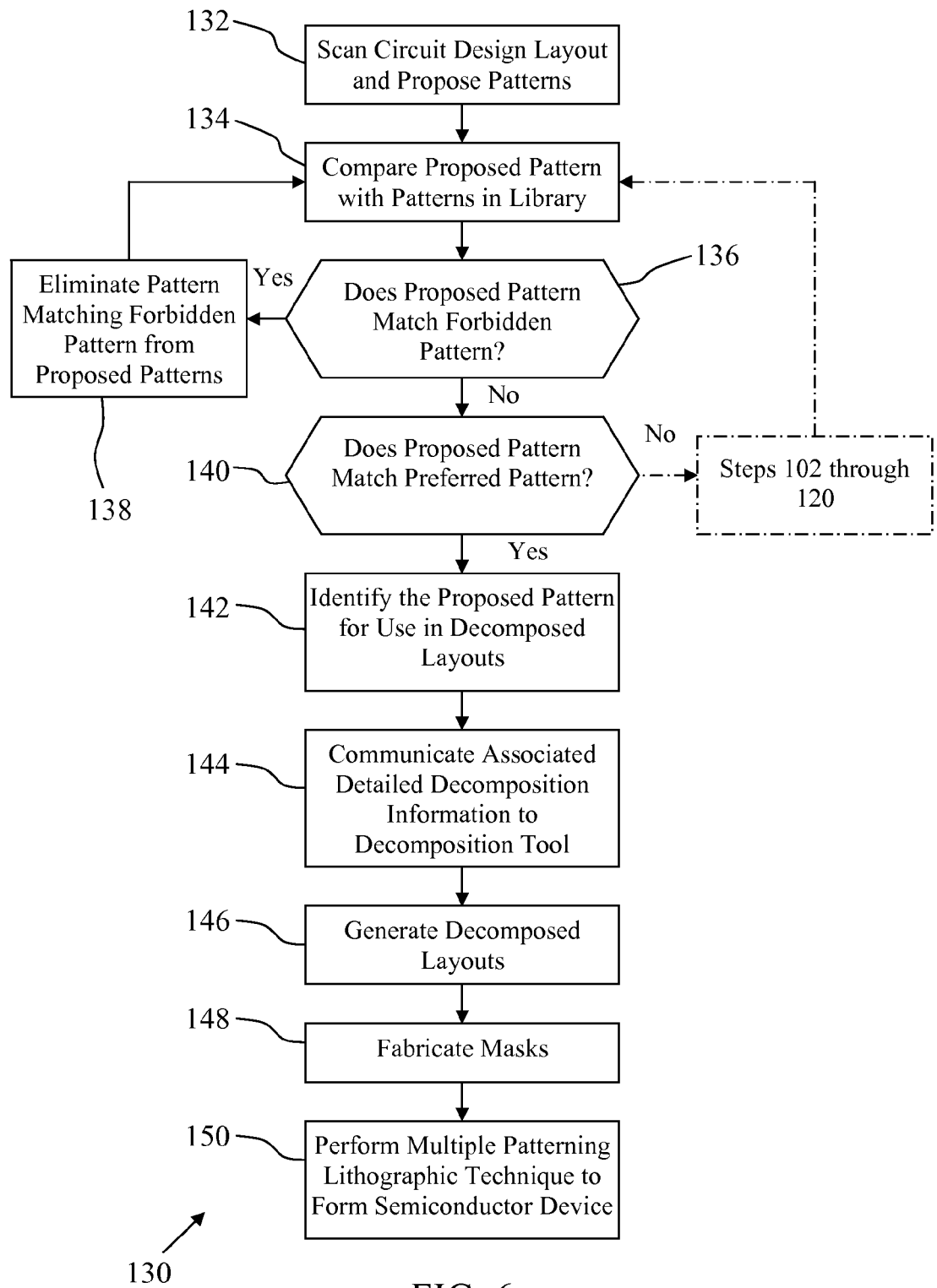
FIG. 6 illustrates, in a flow diagram, method steps for decomposing a circuit design layout and fabricating a semiconductor device from decomposed layouts in accordance with various embodiments herein.

Referring now to FIG. 6, a method 130 of decomposing a circuit design layout is shown. The method 130 begins by scanning a circuit design layout and proposing patterns for the decomposed layouts at step 132. Each proposed pattern is compared with the patterns in the library in step 134. If the proposed pattern matches a forbidden pattern at step 136, then the pattern is eliminated from the proposed patterns at step 138.

If the proposed pattern does not match a forbidden pattern at step 136, then it is determined whether the proposed pattern matches a preferred pattern at step 140. If the proposed pattern matches a preferred pattern, then the proposed pattern is identified for use in the decomposed layouts at step 142. At step 144, the detailed decomposition information associated with the pattern identified in step 142 is communicated from the library to a decomposition tool.

If the proposed pattern does not match a preferred pattern at step 140, then the pattern may be tested and modified according to steps 102 through 120 of FIG. 5. As a result of steps 102 through 120, in further iterations the pattern will match a forbidden pattern at step 136 or a preferred pattern at step 140.

After sufficient patterns have been identified at step 142 to form the decomposed layouts, the decomposed layouts are generated by the decomposition tool at step 146. Each step from 132 through 146 may be computer-executed and, in conjunction with steps 102-120, provides for a continuously updated library of forbidden and preferred patterns as well as decomposed layouts that incorporate up-to-date preferred patterns.

At step 148, masks for the multiple patterning lithographic technique are fabricated. Then, at step 150, the multiple patterning lithographic technique is performed, using the masks on a semiconductor substrate, to form a semiconductor device. It should be understood that various steps and structures may be utilized in further processing, and the subject matter described herein is not limited to any particular number, combination, or arrangement of steps or structures.

To briefly summarize, the fabrication methods described herein provide for manufacturable masks from decomposed layouts checked against a library of forbidden and preferred patterns. The methods facilitate circuit layout decomposition without printability failure points experienced by conventional methods.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a semiconductor device comprising:
    scanning a circuit design layout and proposing patterns for decomposed layouts;
    comparing the proposed patterns with a library of prior patterns including a category of forbidden patterns and a category of preferred patterns;
    if a selected proposed pattern matches a forbidden pattern, eliminating the selected proposed pattern;
    if the selected proposed pattern matches a preferred pattern, identifying the selected proposed pattern for use in the decomposed layouts;
    communicating detailed decomposition information associated with the identified proposed pattern to a decomposition tool;
    generating decomposed layouts from the detailed decomposition information;
    fabricating a plurality of masks based on the decomposed layouts; and
    performing a multiple patterning lithographic technique with the plurality of masks on a semiconductor substrate.

2. The method of claim 1 further comprising assigning each identified proposed pattern to a selected decomposed layout.

3. The method of claim 1 further comprising repeating the scanning, comparing, eliminating, and identifying steps to identify a plurality of proposed patterns for use in the decomposed layouts.

4. The method of claim 1 further comprising:
    providing the library of prior patterns including the category of forbidden patterns, the category of preferred patterns, and detailed decomposition information associated with each preferred pattern, and wherein generating comprises generating the decomposed layouts from the detailed decomposition information with the preferred patterns matched with the identified patterns.

5. The method of claim 4 wherein providing the library of prior patterns comprises:
    simulating printing of a selected prior pattern and identifying printability failure points in the selected prior pattern;
    iteratively modifying the selected prior pattern to reduce printability failure points therein; and
    if the selected prior pattern cannot be modified to eliminate printability failure points therein, adding the selected prior pattern to the forbidden pattern category.

6. The method of claim 5 wherein providing the library of prior patterns comprises:
    if the selected prior pattern is modified to eliminate printability failure points therein, adding the selected prior pattern, as modified, to the preferred pattern category.

7. The method of claim 6 wherein providing further comprises filtering the library to extract unique prior patterns therein.

8. The method of claim 1 wherein the multiple patterning lithographic technique is a double patterning technique, wherein generating the decomposed layouts comprises generating two decomposed layouts, and wherein fabricating the plurality of masks comprises fabricating two masks from the decomposed layouts.

9. A computer-executed method for decomposing a circuit design layout to decomposed layouts for a multiple patterning lithographic technique, the method comprising:
   providing a library of prior patterns, including a category of forbidden patterns;
   scanning the circuit design layout and proposing a plurality of patterns for the decomposed layouts;
   comparing the plurality of patterns with the library of prior patterns;
   if a selected proposed pattern from the plurality of patterns matches a forbidden pattern, eliminating the selected proposed pattern from the plurality of patterns;
   communicating detailed decomposition information associated with a chosen pattern from the plurality of patterns to a decomposition tool;
   generating the decomposed layouts from the detailed decomposition information;
   fabricating a plurality of masks from the decomposed layouts; and
   performing a multiple patterning lithographic technique with the plurality of masks on a semiconductor substrate.

10. The computer-executed method of claim 9 wherein providing the library of prior patterns comprises providing the library including a category of preferred patterns and detailed decomposition information associated with each preferred pattern, and wherein the method further comprises:
   if the selected proposed pattern matches a preferred pattern, identifying the selected proposed pattern as the chosen pattern for use in the decomposed layouts.

11. The computer-executed method of claim 10 further comprising repeating the scanning, comparing, eliminating, identifying, and generating steps to form the decomposed layouts from chosen patterns.

12. The computer-executed method of claim 11 wherein providing the library of prior patterns comprises:
   simulating printing of a selected prior pattern and identifying printability failure points in the selected prior pattern;
   iteratively modifying the selected prior pattern to reduce printability failure points therein; and
   if the selected prior pattern cannot be modified to eliminate printability failure points therein, adding the selected prior pattern to the forbidden pattern category.

13. The computer-executed method of claim 12 wherein providing the library of prior patterns comprises:
   if the selected prior pattern is modified to eliminate printability failure points therein, adding the selected prior pattern, as modified, to the preferred pattern category.

14. The computer-executed method of claim 13 wherein providing further comprises filtering the library to extract unique prior patterns therein.

15. The computer-executed method of claim 10 further comprising assigning each identified pattern to a selected decomposed layout.

16. The computer-executed method of claim 15 wherein the multiple patterning lithographic technique is a double patterning technique, and wherein generating the decomposed layouts from the detailed decomposition information comprises generating two decomposed layouts from the detailed decomposition information.

17. A method for fabricating a plurality of masks for a multiple patterning lithographic technique, the method comprising:
   providing a library of prior patterns, including a category of forbidden patterns and a category of preferred patterns;
   scanning a circuit design layout for the semiconductor device and proposing patterns for decomposed layouts;
   comparing the proposed patterns with the library of prior patterns;
   if a selected proposed pattern matches a forbidden pattern, eliminating the selected proposed pattern;
   if the selected proposed pattern matches a preferred pattern, identifying the selected proposed pattern for use in the decomposed layouts;
   communicating detailed decomposition information associated with the preferred pattern matched with the identified proposed pattern to a decomposition tool;
   generating the decomposed layouts from the detailed decomposition information;
   fabricating the plurality of masks from the decomposed layouts; and
   performing the multiple patterning lithographic technique with the plurality of masks on a semiconductor substrate.

18. The method of claim 17 wherein providing the library of prior patterns comprises:
   simulating printing of a selected prior pattern and identifying printability failure points in the selected prior pattern;
   iteratively modifying the selected prior pattern to reduce printability failure points therein;
   if the selected prior pattern cannot be modified to eliminate printability failure points therein, adding the selected prior pattern to the forbidden pattern category; and
   if the selected prior pattern is modified to eliminate printability failure points therein, adding the selected prior pattern, as modified, to the preferred pattern category.

* * * * *